United States Patent
Sakoda et al.

[11] Patent Number: 5,952,876
[45] Date of Patent: Sep. 14, 1999

[54] FILTER DEVICE

[75] Inventors: Kazuyuki Sakoda; Mitsuhiro Suzuki, both of Chiba, Japan

[73] Assignee: Sony Corporation, Tokyo, Japan

[21] Appl. No.: 08/919,208

[22] Filed: Aug. 28, 1997

[30] Foreign Application Priority Data

Sep. 9, 1996 [JP] Japan .................................... 8-260298

[51] Int. Cl.[6] .................................................. H03K 5/00
[52] U.S. Cl. .......................................... 327/551; 327/552
[58] Field of Search .................................. 327/552, 551, 327/311, 94

[56] References Cited

U.S. PATENT DOCUMENTS 4,961,014  10/1990  Kasahara ................................ 327/552

*Primary Examiner*—Dinh T. Le
*Attorney, Agent, or Firm*—Jay H. Maoili

[57] ABSTRACT

In a filter device a reference clock generator produces a reference clock signal having the stated frequency; a data signal generator generates a data signal which is asynchronous with the reference clock signal; trigger signal generator produces a trigger signal when a discrepancy which exceeds the interval of one clock of the reference signal occurs between the reference clock signal and the data signal; and a digital circuit re-samples the data signal in accordance with the reference clock signal and changes the magnification ratio of the re-sampling by increasing or reducing the sampling period of re-sampling by one clock interval of the reference signal. By changing the magnification ratio of the re-sampling on only the occasion of such a timing that a temporal discrepancy between the reference signal and the data signal has been detected, it can correct the temporal discrepancy which is due to the fact that the frequencies of the reference signal and the data signal are asynchronous with each other and can prevent spectral distortion of the transmission signal, and also it can utilize the reference signal, which is asynchronous with the data signal, for production of the transmission signal without any trouble.

7 Claims, 8 Drawing Sheets

FILTER DEVICE

BACKGROUND OF THE INVENTION

1. Field of the Invention

This invention relates to a filter device and a radio communication terminal equipment, and more particularly, is applicable to a filter device and a radio communication terminal equipment which are employed in a radio communication system in which the communication is performed through such a communication medium that the available frequency band is restricted.

2. Description of the Related Art

Heretofore, in a radio communication terminal equipment of this kind, the data signal which is to be transmitted (this is referred to as the base band signal, hereinafter) is generated as a digital signal. The radio communication terminal equipment converts the generated base-band signal into an analog signal which stays within the stated frequency band by the use of a filter device. After that, a carrier wave is modulated with the base band signal which has been converted into the analog signal and the modulated signal is transmitted.

FIG. 1 generally shows a circuit configuration of a filter device which has been installed within a radio communication terminal equipment, and a clock signal S1 which has been generated in an oscillator 1 is sent to a frequency divider 2. The frequency divider 2 lowers the frequency of the clock signal S1 into one over an integer, so as to generate a reference clock signal S2, and then supplies it to a frequency divider 3 and also supplies it to a transmission filter 4. The frequency divider 3 further lowers the reference clock signal S2 into one over an integer, so as to generate a reference clock signal S3, and then supplies it to a transmission symbol generating division 5. This radio communication terminal is used as a terminal which is directed to CDMA-PCS, and J-STD-008 of ANSI standard prescribes that the frequency of the base band signal which is generated in the transmission symbol generating division 5 should be 1.2288 MHz. Therefore, the clock signal S1 which is generated in the oscillator 1 should be 19.6608 MHz, the reference clock signal S2 which is generated in the frequency divider 2 should be 4.9152 MHz, and the reference clock signal S3 which is generated in the frequency divider 3 should be 1.2288 MHz.

The transmission symbol generating division 5 generates a base band signal S4, on the basis of the given reference clock signal S3. The transmission symbol generating division 5 sends the base band signal S4 which has the same frequency as that of the reference clock signal S3 to the transmission filter 4.

The transmission filter 4 is comprised of a re-sampler 6, a digital filter 7, and a digital-to-analog converter (this is referred to as a D/A converter) 8, and acts on the basis of the reference clock signal S2 which is given from the frequency divider 2. The transmission filter 4 inputs the base band signal S4 which is given from the transmission symbol generating division 5 to the re-sampler 6. The re-sampler 6 performs over-sampling processing of the base band signal S4 with the frequency of the reference clock signal S2. The re-sampler 6 thus performs the over-sampling processing on the basis of the reference clock signal S2, the frequency of which is an integer times that of the base band signal S4. The re-sampler 6 delivers a pulse signal S5 which has been obtained through such over-sampling processing to the digital filter 7. The digital filter 7 re-quantizes the pulse signal S5, in accordance with the stated frequency characteristic. The digital filter 7 delivers a quantized signal S6 which has been obtained by such quantization to the D/A converter 8. The D/A converter 8 converts the quantized signal S6 into an analog signal, and then extracts only the stated frequency band of this with an analog low-pass filter (not shown) and outputs it.

That is, as shown in FIG. 2A, the base band signal S4 which has been produced in the transmission symbol generating division 5 is an impulse string of 1.2288 MHz, and, when this is viewed on the frequency axis, a band of 1.2288 MHz width appears repeatedly for each 1.2288 MHz.

As shown in FIG. 2B, the re-sampler 6 performs over-sampling of such base band signal S4 with 4.9152 MHz, which is four times 1.2288 MHz, so as to broaden one bandwidth of the base band signal S4 into 4.9152 MHz width. This one band of 4.9152 MHz contains the original information of 1.2288 MHz as much as four times over. To be concrete, such over-sampling sampling is achieved by interpolating the information of three "0" (dotted portions between the respective impulses, in the figure) between the impulse string of the base band signal S4.

As shown in FIG. 2C, the band of the pulse signal S5 which has been thus obtained by over-sampling is narrowed by the digital filter 7. By sending the quantized signal S6 which has been obtained by narrowing the bandwidth in this way, the transmission filter 4 is able to issue the signal which forms the envelope shown in the figure. By outputting the thus issued signal via an analog low-pass filter, the radio communication terminal equipment extracts and outputs only the stated frequency band.

By performing over-sampling processing in this way with the transmission filter 4, the radio communication terminal equipment is able to broaden the respective intervals between the frequency bands of the base band signal S4, and is so able to extract the stated frequency band easily with the analog low-pass filter (not shown). That is, the radio communication terminal equipment is adapted to alleviate the characteristics which are required of the analog low-pass filter so as to reduce the load, by exposing the base band signal S4 to over-sampling processing.

On the other hand, J-STD-008 of the above-mentioned ANSI standard prescribes that the setting interval of the code division multiple access (CDMA) channels which are used for transmission/reception should be 50 kHz. So, in a radio communication terminal equipment based on the standard, a clock signal of an integer times 50 kHz is generated, and this is supplied to a frequency divider, which has been equipped within an RF module for performing frequency adjustment of the transmitted/received signal, and a PLL synthesizer is activated, and thereby tuning is performed in a 50 kHz division manner.

That is, from the above, in a radio communication terminal equipment based on J-STD 008 of ANSI standard, it is required to equip oscillators each generating a clock signal for generating the base band signal S4 and a clock signal for performing channel tuning, separately. At here, it may be suggested to provide a oscillator which generates a clock signal having a frequency of the common multiple of the both, however, it is at variance with the real conditions because the frequency becomes very high.

By the way, in the radio communication terminal equipment of such configuration, both the oscillator 1 for generating the base band signal S4 and an oscillator for tuning of the channels are needed, as stated above. In this connection, an oscillator which is referred to as a voltage controlled temperature compensated quartz-crystal oscillator (VCTCXO) is usually utilized as an oscillator for generating the clock signal which is used for the radio communication terminal equipment, because the clock signal requires high precision.

However, in the case where separate oscillators are provided in this way, there are such problems that the locations of the respective oscillators are set in the equipment and so the mounting area for mounting of the other components is reduced, so that the configuration may be complicated and miniaturization of the equipment may be interrupted. To avoid such problems, an approach is needed wherein clock signals of two frequencies are respectively generated from one oscillator.

For instance, a clock signal untouched which has been generated in the oscillator is used as the clock signal for channel tuning. On the other hand, frequency conversion of the clock signal which has been generated by the oscillator is performed to produce the clock signal for generating the base band signal. In this way, the clock signals having two different frequencies can be obtained from the clock signal which is generated by one oscillator.

However, the clock signal for base-band signal creation which has been obtained by such frequency conversion contains jitter components, because it is not an oscillated signal which has been generated by an oscillator. Such a clock signal does raise a large problem at the time of creation of the base band signal of digital signal. But, there is such a problem that a spectral distortion occurs in the outputted transmission signal, in the case where the base band signal which has been produced on the basis of such a clock signal is subjected to digital-to-analog conversion and then inputted to the transmission filter for creating the analog transmission signal.

SUMMARY OF THE INVENTION

In view of the foregoing, an object of this invention is to provide a transmission filter and a radio communication terminal equipment which can correct the spectral distortion of the transmission signal owing to jitter components and simplify the configuration.

The foregoing object and other objects of the invention have been achieved by the provision of a filter device according to this invention, in which reference clock issuing means issues a reference clock signal having the stated frequency, data signal generating means generates a data signal which is asynchronous with the reference clock signal, trigger signal issuing means issues a trigger signal when a discrepancy which exceeds the interval of one clock of the reference signal occurs between the reference clock signal and the data signal, and digital circuit means re-samples the data signal in accordance with the reference clock signal and changes the magnification ratio of the re-sampling by increasing or reducing the sampling period of re-sampling for one clock interval of the reference signal.

By changing the magnification ratio of the re-sampling on only the occasion of such a timing that a temporal discrepancy has been detected between the reference signal and the data signal, it is able to correct the temporal discrepancy which is due to the face that the frequency of the reference signal and the frequency of the data signal are asynchronous with each other and to prevent occurring of spectral distortion of the transmission signal, and it is above to utilize the reference signal which is asynchronous with the data signal supplied to the other system for producing the transmission signal without any trouble.

The nature, principle and utility of the invention will become more apparent from the following detailed description when read in conjunction with the accompanying drawings in which like parts are designated by like reference numerals or characters.

DETAILED DESCRIPTION OF THE EMBODIMENT

Figure 1:
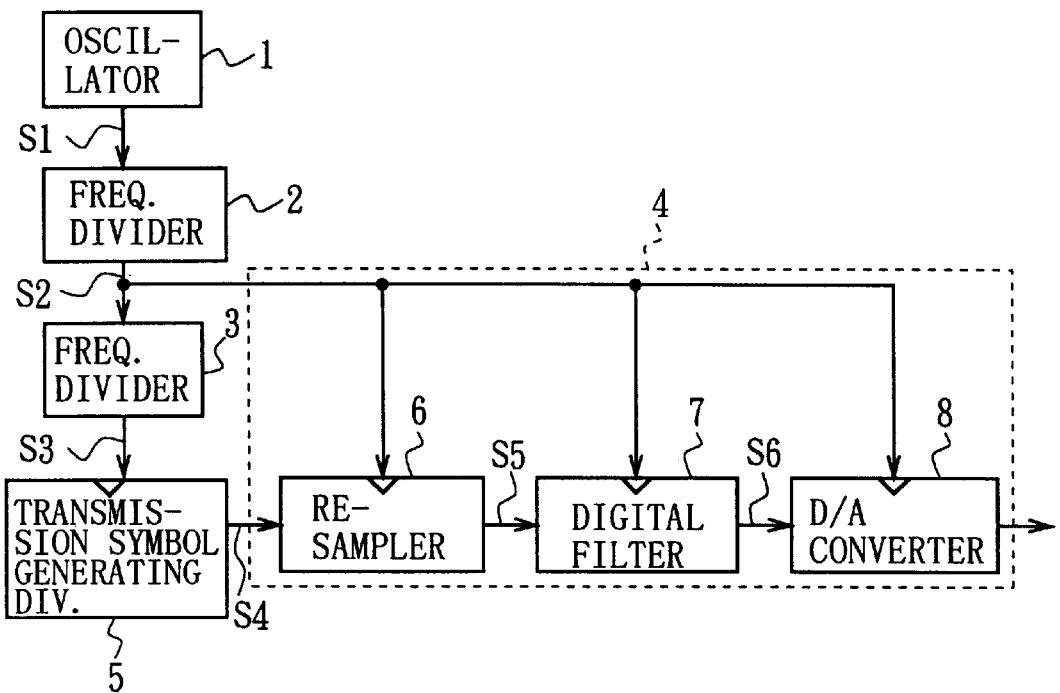
FIG. 1 is a block diagram showing the configuration of a conventional transmission filter and its associated circuits.
Figure 3:
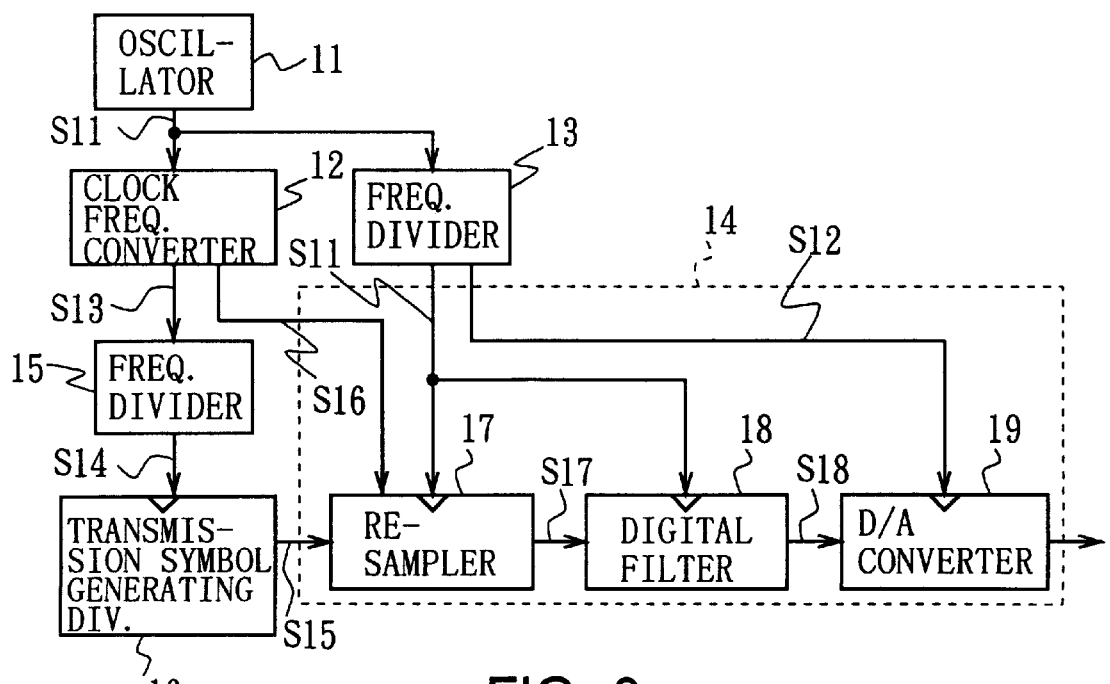
FIG. 3 is a block diagram showing the configuration of the transmission filter and its associated circuits according to the first embodiment.
Figures 2A, 2B, 2C:
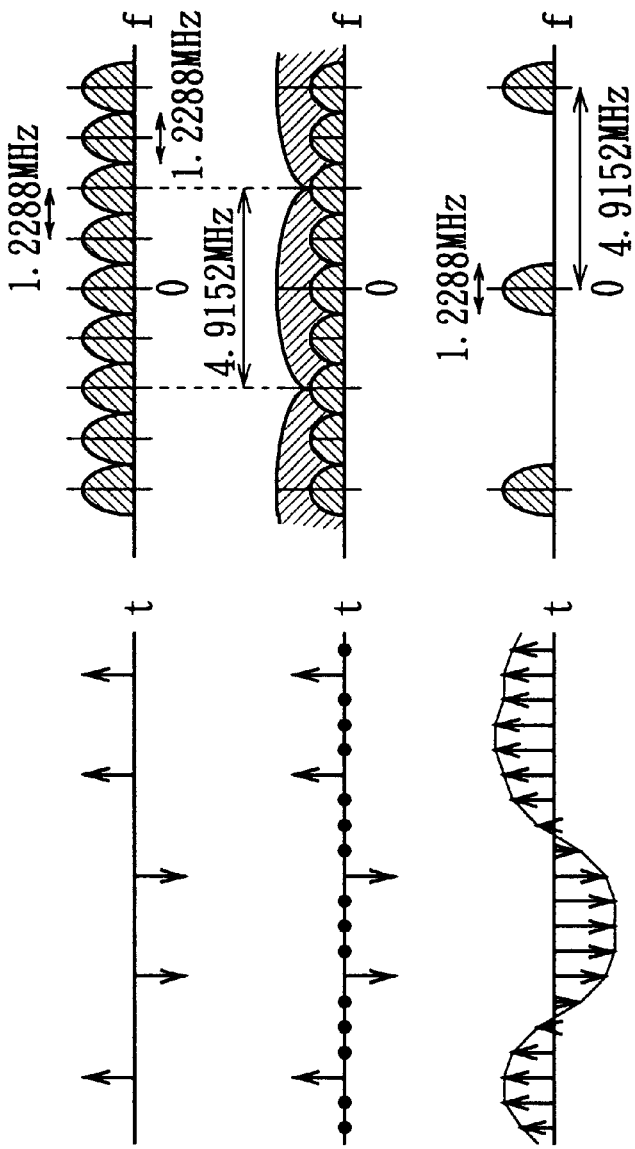
FIGS. 2A to 2C are schematic diagrams used in the explanation of processing of the signal by the transmission filter.

Preferred embodiments of this invention will be described with reference to the accompanying drawings:

FIG. 3 shows, as a whole, the circuit configuration of a filter device which has been provided within a radio communication terminal equipment, in which a clock signal S11 which has been generated in an oscillator 11 is supplied to each of a clock frequency converter 12 and a frequency divider 13. The frequency of the clock signal S11, which is 19.8 MHz, is not an integer times 1.2288 MHz of the base band signal S15 which is generated in a transmission symbol generating division 16.

On the basis of the clock signal S11 which has been supplied from the oscillator 11, the frequency divider 13 generates a reference clock signal S12 which is produced by lowering the frequency of the clock signal S11 into one over an integer. More specifically, the frequency of the clock signal S11 is divided in four, so as to generate the reference clock signal S12 of the frequency of 4.95 MHz. The frequency divider 13 supplies the clock signal S11 and the reference clock signal S12 to a transmission filter 14. In the transmission filter 14, the clock signal S11 is supplied to a re-sampler 17 and a digital filter 18, and the reference clock signal S12 is supplied to a D/A converter 19.

On the other hand, the clock frequency converter 12 pulls one pulse-wave out of the clock signal S11 for each stated period, so as to generate a clock signal S13 which is the clock signal S11 whose timing frequency has been changed. More specifically, by pulling one pulse-wave out of the clock signal S11 for each interval of 4125/29, the reference clock signal S13 of 19.6608 MHz which is an integer times the frequency 1.2288 MHz of the base band signal S15 is generated imitatively. That is, the interval by which a pulse-wave is to be pulled out is obtained from the ratio of the difference value between the frequency of the clock signal S11 and the frequency of the base band signal S15 to the frequency of the clock signal S11, that is, $$\frac{f_{in}}{f_{in} - f_{out}} \quad (1)$$

where $f_{in}$ is the frequency of the clock signal S11 which is generated by the oscillator 11, and $f_{out}$ is the frequency of the base band signal S15. By pulling the pulse-waves out of the clock signal S11 on the basis of such intervals, the clock frequency converter 12 can obtain the output of the frequency of $f_{out}$.

However, the clock signal S13, which is the output of the clock frequency converter 12, is divided by a divider 15. Therefore, in practice, the interval by which a pulse-wave is to be pulled out is obtained from the ratio of the difference value between the frequency of the clock signal S11 and N times the frequency of the base band signal S15 to the frequency of the clock signal S11, that is, $$\frac{f_{in}}{f_{in} - (N \times f_{out})} \quad (2)$$

where N is the factor of frequency dividing of the frequency divider 15. Since the frequency fin of the clock signal S11 is 19.8 MHz, the frequency of the base band signal S15 is 1.2288 MHz, and the factor N of frequency dividing of the frequency divider 15 is sixteen as described herein below, it is known, from Equation (2), that the output of the frequency 1.2288 MHz of the base band signal S15 can be obtained, by pulling the pulse-waves at intervals of 4125/29 as stated above and then dividing the signal whose pulse-waves have been pulled out with the frequency divider 15.

The clock frequency converter 12 delivers the generated reference clock signal S13 of 19.6608 MHz to the frequency divider 15. The frequency divider 15 performs frequency dividing of the reference clock signal S13 by the factor of sixteen, so as to generate a reference clock signal S14 of 1.2288 MHz, and then supplies it to the transmission symbol generating division 16. On the basis of the reference clock signal S14, the transmission symbol generating division 16 generates the base band signal S15 of the same frequency, and then delivers it to the transmission filter 14.

While, the clock frequency converter 12 generates a trigger signal S16 at the timing of pulling the pulse-wave out of the clock signal S11, and delivers it to the transmission filter 14. The transmission filter 14 supplies the trigger signal S16 to the re-sampler 17.

The re-sampler 17 performs over-sampling of the base band signal S15, on the basis of the clock signal S11. The magnification ratio of the over-sampling is sixteen, basically. In this case, since the base band signal S15 is 1.2288 MHz and the clock signal S11 is 19.8 MHz, the clock signal S11 and the base band signal S15 are not synchronized with each other. Therefore, the pace of re-sampling of the re-sampler 17 and the pace of inputting of the base band signal S15 are deviated from each other. The re-sampler 17 corrects this deviation by using the trigger signal S16.

The trigger signal S16 is supplied from the clock frequency converter 12 to the re-sampler 17. This trigger signal S16 is generated at the timing of pulling the pulse-wave out of the clock signal S11 of 19.8 MHz, therefore, it can be said that the signal S16 shows the timing for correcting the deviation between the clock signal S11 and the reference clock signal S13 of 19.6608 MHz. The re-sampler 17 inserts one clock into the interval of the over-sampling at the timing which is shown by the trigger signal S16, and performs the over-sampling with the magnification ratio of seventeen rather than sixteen on only the occasion of such timing, and hereby corrects the above-mentioned deviation. The re-sampler 17 delivers a pulse signal S17 of 19.8 MHz which is obtained by such over-sampling of the base band signal S15 to the digital filter 18.

The digital filter 18 operates on the basis of the clock signal S11, and reduces the frequency bandwidth of the pulse signal S17 of 19.8 MHz, so as to generate a quantized signal S18 of 4.95 MHz. More specifically, the filter 18 generates the signal S18 at the rate of four pulse-waves of the pulse signal S17 to one. The digital filter 18 delivers the quantized signal S18 which has been obtained in this way to the D/A converter 19.

The D/A converter 19, which operates on the basis of the reference clock signal S12 of 4.95 MHz, converts the quantized signal S18 which is a digital signal into an analog signal and then outputs it. The signal which has been converted into analog in this way is then inputted to an analog low-pass filter (not shown), and only the desired frequency component of it is extracted.

The reason will be explained why the frequency of the clock signal S11 which is generated by the oscillator 11 is set to 19.8 MHz in the above configuration. At first, four conditions which are required to the clock signal S11 are explained.

First, an oscillator which is used in a radio communication terminal equipment is generally a voltage-controlled quartz-crystal oscillator, and, in particular, those of ten-odd MHz to twenty-odd MHz are easy to acquire. Hence, it is preferable that the clock signal is set to ten-odd MHz to twenty-odd MHz. Secondly, in a radio communication terminal equipment, the base band signal of 1.2288 MHz is subjected to over-sampling with the magnification ratio of eight or four in the transmission side or the reception side, therefore, the clock signal is needed whose frequency is, at least, eight times 1.2288 MHz. Thirdly, because J-STD-008 of ANSI standard provides that the channel interval of code division multiple access (CDMA) channel should be 50 kHz, a signal whose frequency is an integer times 50 kHz is needed as the clock signal for tuning. Fourthly, it is taken into consideration that J-STD-008 of ANSI standard should be able to deal with an analog communication system. In the advanced mobile phone system (AMPS) which is a typical form of the analog communication system, the channel interval is 30 kHz. So, it is desired that the frequency of the clock signal for tuning is an integer×30 kHz.

However, it is difficult to satisfy all of the above conditions, so any condition should be eliminated; hereat the second condition, that is, such a condition that the frequency should be eight times 1.2288 MHz is eliminated from the necessary conditions. But, this does not create a great problem, since the reference clock signal S13 of the frequency which is an integer times the base band signal S15 can be generated imitatively, using the clock signal S11 of the frequency which approximates an integer times the frequency of the base band signal S15, by the above-mentioned configuration and method.

That is, a frequency which is an integer times that of the base band signal S15 according to the second condition and capable of satisfying the first condition becomes a signal of the frequency of 19.6608 MHz, however, this frequency can not satisfy the third condition. So, it is known that a signal of the frequency of 19.8 MHz is adequate as the clock signal S11 which is generated in the oscillator 11, since its frequency approximates the frequency 19.6608 MHz and satisfies the third and the fourth conditions.

The radio communication terminal equipment generates the clock signal S11 of 19.8 MHz which satisfies the above-mentioned conditions by means of the oscillator 11, and uses it for tuning of the channels (not shown), and then takes the pulse-wave from the clock signal S11 at each interval which is obtained from Equation (2) with the clock frequency converter 12, so that the reference clock signal S13 of the frequency of 19.6608 MHz can be generated imitatively, and the base band signal S15 of 1.2288 MHz can be generated from this reference clock signal S13.

In this way, the radio communication terminal equipment has been adapted to imitatively generate the reference clock signal S13 on the basis of the clock signal S11 which is generated by the oscillator, and so, from the clock signal S11 which has been generated by a single oscillator 11 the equipment is able to obtain the reference clock signal S13 of the different frequency; so that the whole configuration can be simplified. Because a voltage controlled temperature compensated quartz-crystal oscillator (VCTCXO) which is generally used as the oscillator 11 is expensive, the entire of the radio communication terminal equipment has been adapted to be driven with only the clock signal S11 which is generated by the single oscillator 11 without any trouble; so that the cost of the equipment can be reduced.

Besides, the base band signal S15 which is generated on the basis of the reference clock signal S13 is subjected to over-sampling by the re-sampler 17. More specifically, the re-sampler 17 performs the over-sampling process, virtually treating 19.6608 MHz, which is the frequency of sixteen times the base band signal S15, as the operating-frequency, and so the base band signal S15 is subjected to the over-sampling process of the magnification ratio of 16. But, the re-sampler 17 is driven on the basis of the clock signal S11 of 19.8 MHz in practice, therefore, such a timing occurs that the inputting of the base band signal S15 lags with respect to the over-sampling process. In the case where the over-sampling process has been performed in a state where such a lag has occurred, a spectral distortion occurs in the obtained pulse signal S17.

For this reason, the trigger signal S16 is supplied to the re-sampler 17 from the clock frequency converter 12, and the magnification ratio of the sampling is varied in accordance with the timing which is indicated by the trigger signal S16. The clock frequency converter 12 imitatively generates the reference clock signal S13 by removing only a part of the pulse wave which corresponds to 1 clock from the clock signal S11 for each stated interval, and supplies the trigger signal S16 which indicates the timing of removal to the re-sampler 17. The re-sampler 17 performs the over-sampling process, basically, with the over-sampling ratio of sixteen, and performs the over-sampling process with the over-sampling ratio of seventeen on only the occasion of such a timing that the trigger signal S16 has been inputted.

That is, in view of the fact that the sampling frequency of the re-sampler 17 and the base band signal S15 are not synchronized with each other due to the removal of a part of the pulse wave which corresponds to one clock by the clock frequency converter 12, the timing discrepancy based on the above-mentioned lag can be corrected, by increasing the over-sampling ratio of the sampling by the magnitude which corresponds to one clock and performing over-sampling with the over-sampling ratio of seventeen on the occasion of the timing which is indicated by the trigger signal S16.

In this way, the radio communication terminal equipment varies the over-sampling ratio of sampling of the re-sampler 17 in accordance with the trigger signal S16, therefore, the deviation of timing of the base band signal S15 with respect to the sampling frequency can be corrected, and the spectral distortion which occurs in the pulse signal S17 can be minimized. In this connection, even though such correction process has been performed, a little distortion occurs in the energy (that is, spectrum) of the pulse signal S17, however, this does not become a great problem, since the energy is simply reduced to $16/17$.

According to the above configuration, by removing a part of the pulse wave which corresponds to one clock from the clock signal S11 which is generated by the oscillator 11 at the stated interval by means of the clock frequency converter 12, the reference clock signal S13 of the different frequency can be obtained, while, by varying the over-sampling ratio of sampling in accordance with the trigger signal S16 which is issued by the clock frequency converter 12 at the timing of removing of the pulse wave, the synchronous discrepancy between the clock signal S11 for driving the re-sampler 17 and the base band signal S15 can be corrected, and the spectral distortion which occurs in the pulse signal S17 can be minimized. Since the over-sampling process can be performed in this way without any trouble by the use of the clock signal S11 which is not synchronized with the base band signal S15, the radio communication terminal equipment can be realized with a simple configuration.

Figure 4:
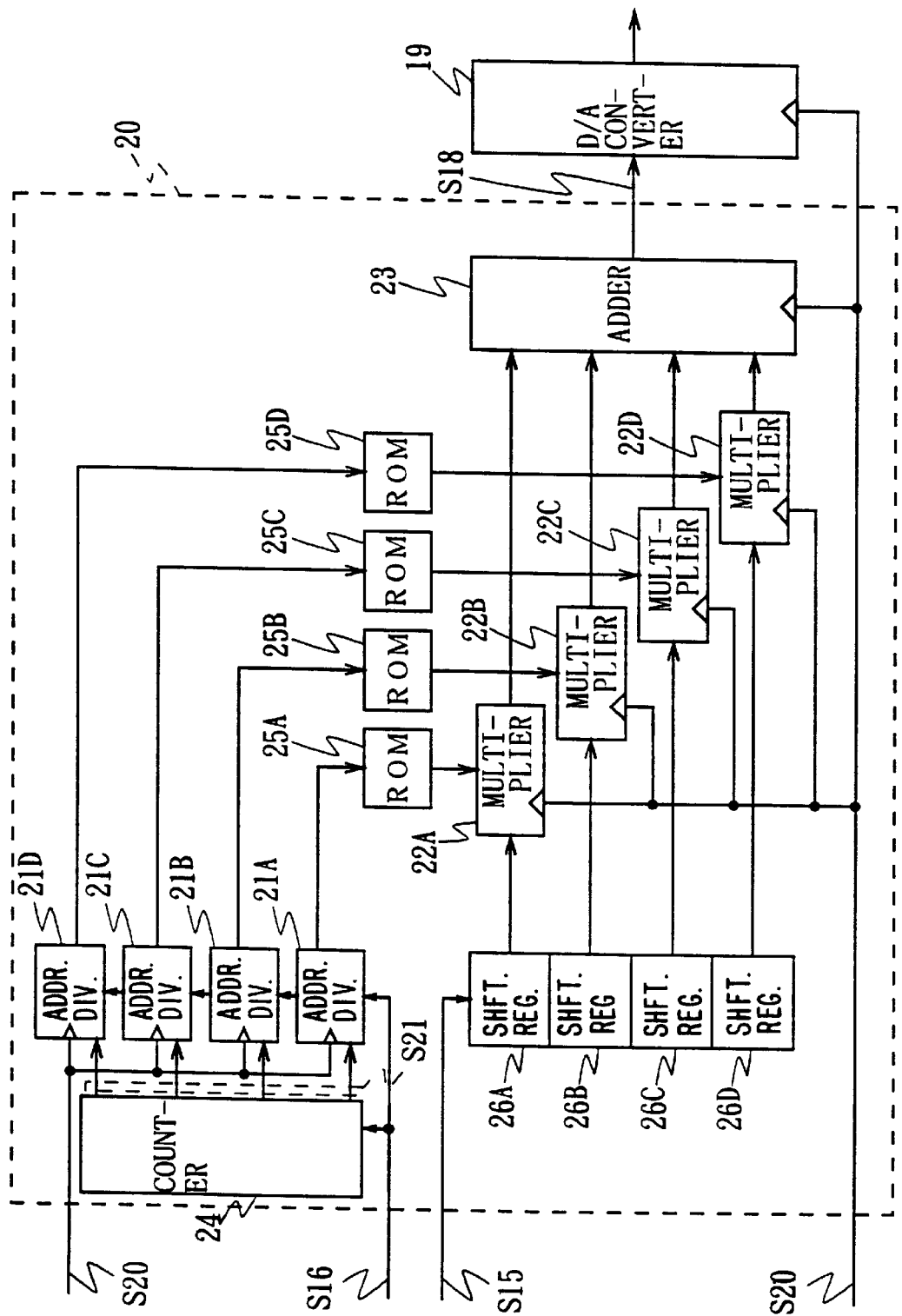
FIG. 4 is a block diagram showing the internal configuration of the transmission filter according to the second embodiment.

In FIG. 4, 20 shows an internal configuration of the transmission filter in the radio communication terminal equipment as a whole, and it has such a circuit configuration that the digital filter and the re-sampler have been unified.

A reference clock signal S20 of 4.95 MHz, which is obtained by performing frequency dividing of the clock signal S11 of 19.8 MHz (FIG. 3), is supplied to the transmission filter 20, and the reference clock signal S20 is inputted to addressing divisions 21A to 21D, multipliers 22A to 22D, and an adder 23. Besides, the reference clock signal S20 is supplied to the D/A converter 19, too.

The transmission filter 20 inputs the trigger signal S16 which is from clock frequency converter 12 (FIG. 3) to a counter 24 and the addressing division 21A. Here, in the case where the trigger signal S16 has been inputted to the addressing division 21A, the addressing divisions 21A to 21D sequentially deliver the trigger signal S16 from the addressing division 21A to 21B, in turn, from 21B to 21C, and then from 21C to 21D. While, the counter 24 counts the number of inputs of the trigger signal S16, and sends a control signal S21 to the addressing divisions 21A to 21D, once for every four inputs.

Every time the reference clock signal S20 has been inputted, each of addressing divisions 21A to 21D calculates the address for reading the data which is stored in each ROM, and then delivers the obtained address value to the corresponding ROM 25A to 25D. On the occasion where the control signal S21 has been supplied from the counter 24, each of the addressing divisions 21A to 21D selects the address value of the stated value which has been previously set, and delivers it to the corresponding ROM 25A to 25D.

Each of the ROMs 25A to 25D is storing the tap value, which will be described herein below, for performing over-sampling of the base band signal S15 at 16× magnification, as the data, for each address value, and issues these tap values in accordance with the address value which has been specified by each addressing division 21A to 21D. More specifically, the ROM25A is storing the zero to sixteenth tap values in the address values zero to sixteen respectively, the ROM25B is storing the sixteenth to thirty-second tap values in the address values zero to sixteen respectively, the ROM25C is storing the thirty-second to forty-eighth tap values in the address values zero to sixteen respectively, and the ROM25D is storing the forty-eighth to sixty-fourth tap values in the address values zero to sixteen respectively. This is a setting for the case where the number of taps is sixty-five when it acts as a digital filter, and the trigger signal S16 will be never generated within the interval of sixty-five pulses or less with the clock signal S11.

FIGS. 5A to 5D are state-transition diagrams of the values which are respectively outputted from the ROMs 25A to 25D in accordance with the values outputted by the addressing divisions 21A to 21D, in the case where the number of the taps of the digital filter is sixty-five and the trigger signal S16 will be never generated within the interval of sixty-five pulses or less.

Figure 5A:
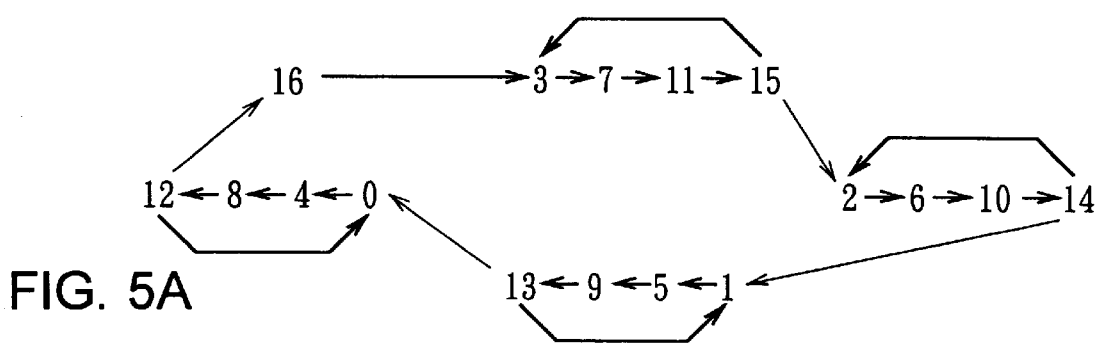
FIGS. 5A to 5D are schematic diagrams used in explanation of the state transition of the address value which is indicated by the addressing division.
Figure 5B:
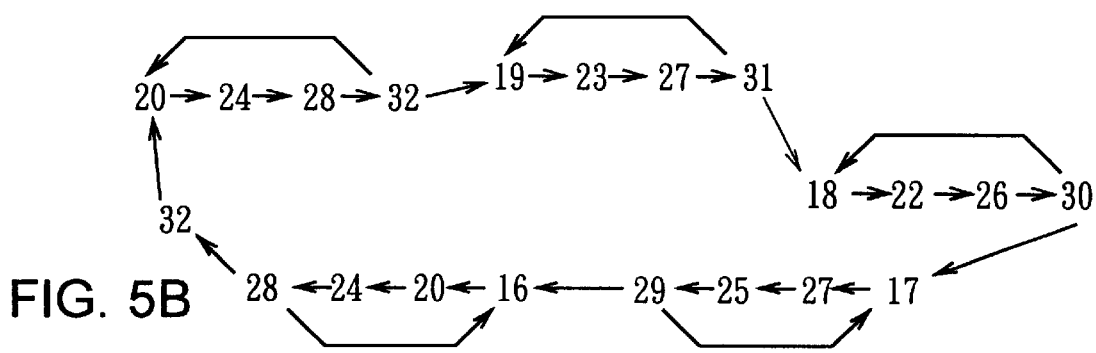
Figure 5C:
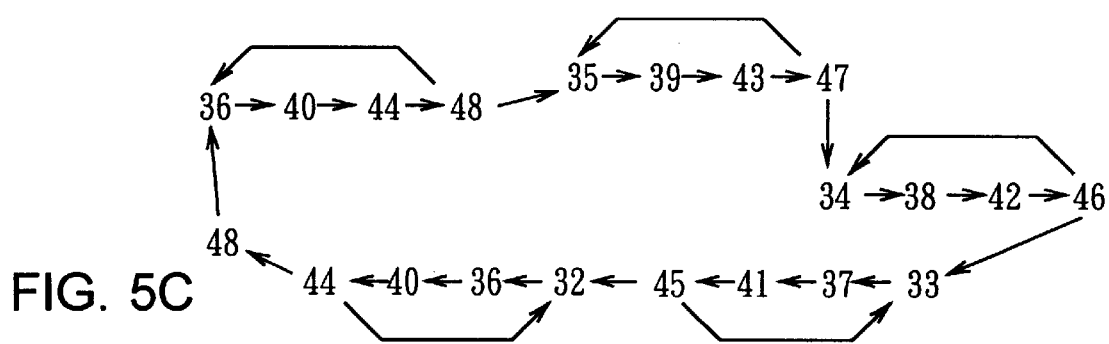
Figure 5D:
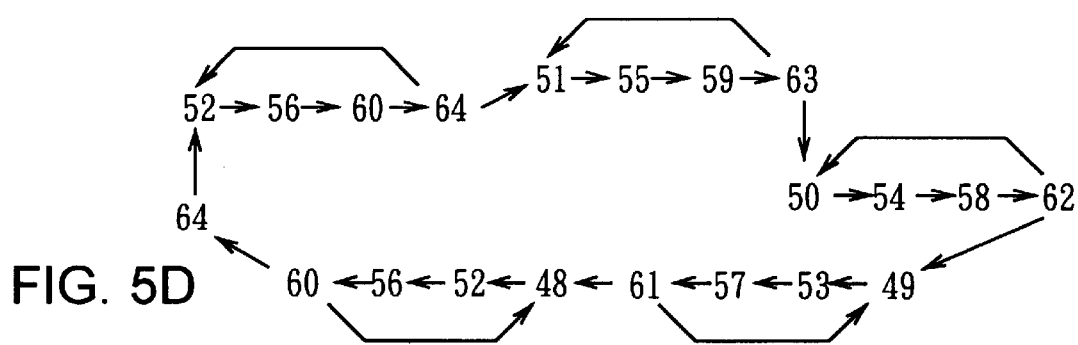

As shown in FIG. 5A, in, for instance, the addressing division 21A, the address value is specified so that the tap value which is read from the ROM 25A may become the repeating state of the sequence 3, 7, 11, 15, and, when the trigger signal S16 has been inputted, the address value is shifted so that the tap value may become the repeating state of 2, 6, 10, 14. While, as shown in FIG. 5B, in, for instance, the addressing division 21B, the address value is specified so that the tap value which is read from the ROM 25B may become the repeating state of the sequence 19, 23, 27, 31, and, when the trigger signal S16 has been inputted, the address value is shifted so that the tap value may become the repeating state of 18, 22, 26, 30. While, as shown in FIG. 5C, in, for instance, the addressing division 21C, the address value is specified so that the tap value which is read from the ROM 25C may become the repeating state of the sequence 35, 39, 43, 47, and, when the trigger signal S16 has been inputted, the address value is shifted so that the tap value may become the repeating state of 34, 38, 42, 46. While, as shown in FIG. 5D, in, for instance, the addressing division 21D, the address value is specified so that the tap value which is read from the ROM 25D may become the repeating state of the sequence 51, 55, 59, 63, and, when the trigger signal S16 has been inputted, the address value is shifted so that the tap value may become the repeating state of 50, 54, 58, 62.

That is, in the addressing divisions 21A to 21D, the address values which are newly specified are calculated from the equation $$\text{addr-new} = (\text{addr-old} + 4) \bmod 16 + N \qquad (3)$$

$$\text{where:} \begin{cases} N = 0 \text{ in } 21A \\ N = 16 \text{ in } 21B \\ N = 32 \text{ in } 21C \\ N = 48 \text{ in } 21D \end{cases}$$

at the respective timings which are indicated by the reference clock signal S20; where, the address value which is newly specified is designated as addr-new, and the address which has been specified at the previous timing is designated as addr-old. This means that the address which is subsequently specified is calculated such that it jumps to the fourth from the previous address value. By reading the tap values for 16× over-sampling which are stored in the respective ROMs 25A to 25D for every four address values, the transmission filter 20 thus delivers, with the frequency 4.95 MHz, the base band signal S15 which is obtained by 16× over-sampling with the frequency 19.8 MHz.

In the case where the trigger signal S16 has been inputted and a flag has been set, the address value for changing to the new transition state is calculated from the equation $$\begin{aligned}\text{addr-new} &= (\text{addr-old} + 4 - 1) \bmod 16 + N \qquad (4) \\ &= (\text{addr-old} + 3) \bmod 16 + N\end{aligned}$$

$$\text{where:} \begin{cases} N = 0 \text{ in } 21A \\ N = 16 \text{ in } 21B \\ N = 32 \text{ in } 21C \\ N = 48 \text{ in } 21D \end{cases}$$

at each timing which is indicated by the reference clock signal S20, in order to correct the discrepancy of the timings of the base band signal S15 and the reference clock signal S20. After this, the addressing division 21A continues to calculate the address value on the basis of the equation (3), again.

Figure 6:
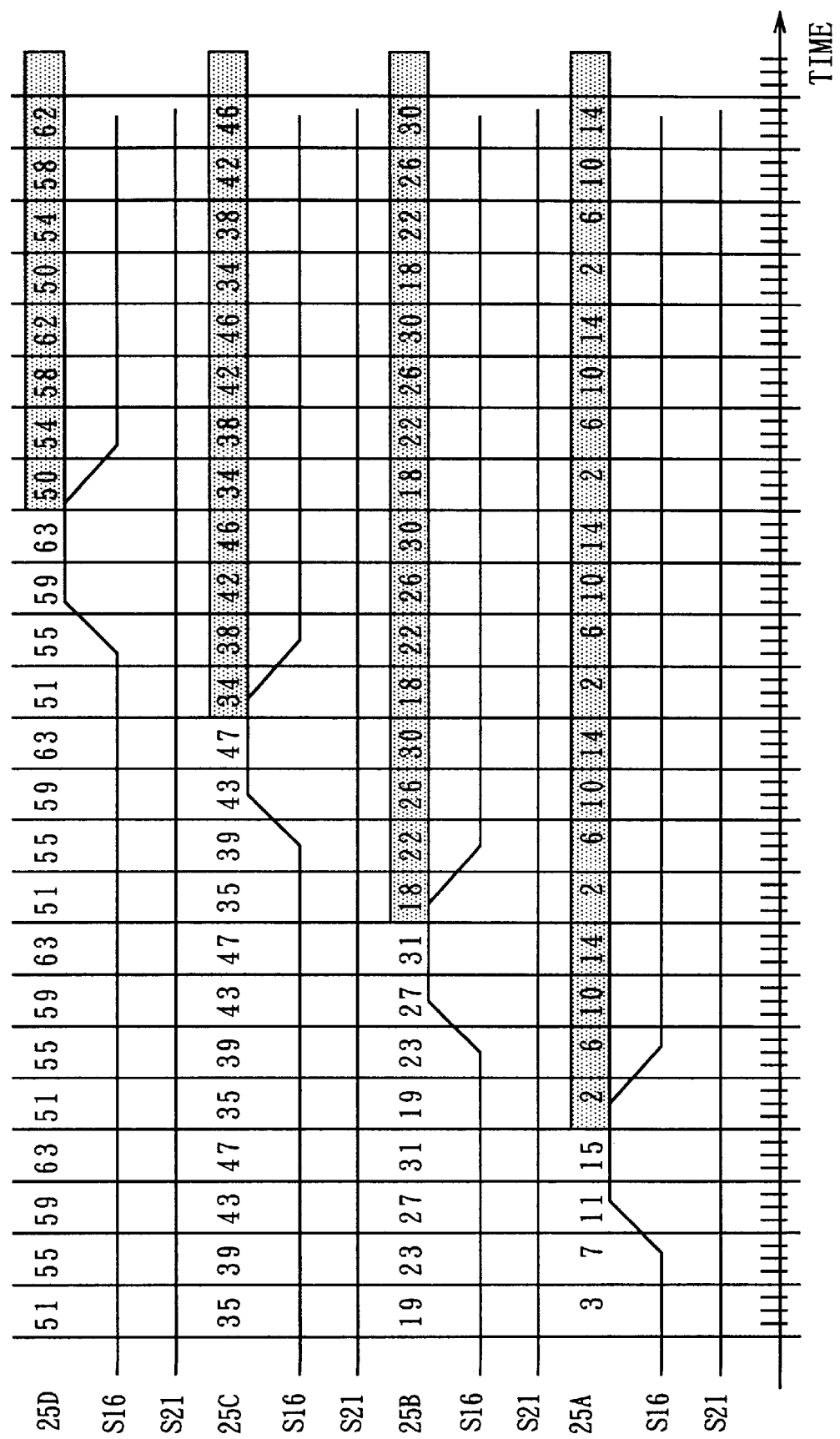
FIG. 6 is a time chart used in explanation of the tap value which changes in accordance with the address value which is issued by each addressing division in the case where the control signal is not given from the counter.

As shown in FIG. 6, the tap value which is read from each ROM 25A to 25D on the basis of such specification of the address value changes in accordance with the stated repetitive sequence. In the case where the flag has been set owing to the fact that the trigger signal S16 has been inputted, the address value transition which causes the tap value to change within the repeating state of the sequence 3, 7, 11, 15 moves to the new transition state and becomes the repeating state of the sequence 2, 6, 10, 14, at the time the address value is to be returned to the foremost address value, for instance, at the time the tap value is to be shifted to 3 from 15. In like manner, in the case where the flag has been set owing to the fact that the trigger signal S16 has been inputted, the repeating state of 19, 23, 27, 31 moves to the transition state of 18, 22, 26, 30, while the repeating state of 35, 39, 43, 47 moves to the transition state of 34, 38, 42, 46, while the repeating state of 51, 55, 59, 63 moves to the transition state of 50, 54, 58, 62.

In the case where the trigger signal S16 is generated with the interval of, for instance, sixty-five (that is, the number of the taps of the filter) pulses or less, two or more tap values may be stored in each ROM 25A to 25D in an overlapping manner. As to the addressing divisions 21C and 21D, in the case where the trigger signal S16 is possible to be generated with the interval of thirty-three pulses or more (that is, in the case where it is not generated with the interval of thirty-two pulses or less, but possible to be generated with the interval of sixty-five pulses or less), as shown in FIGS. 7A to 7D, the transition states whereto they are newly moved differ between the case where the trigger signal S16 has been inputted and the case where the control signal S21 has been inputted.

Figure 7A:
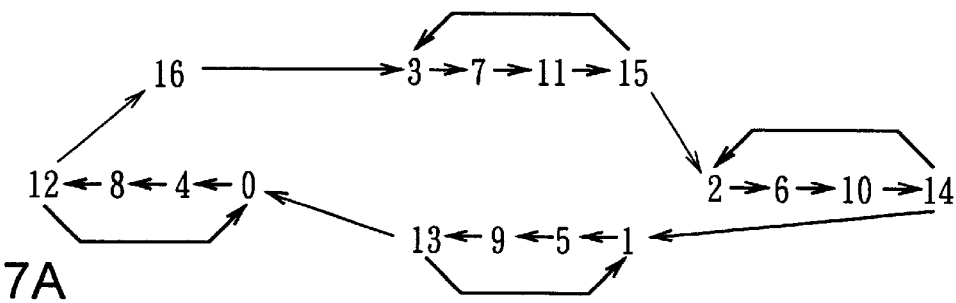
FIGS. 7A to 7D are schematic diagrams used in explanation of the state transition of the address value which is indicated by the addressing division.
Figure 7B:
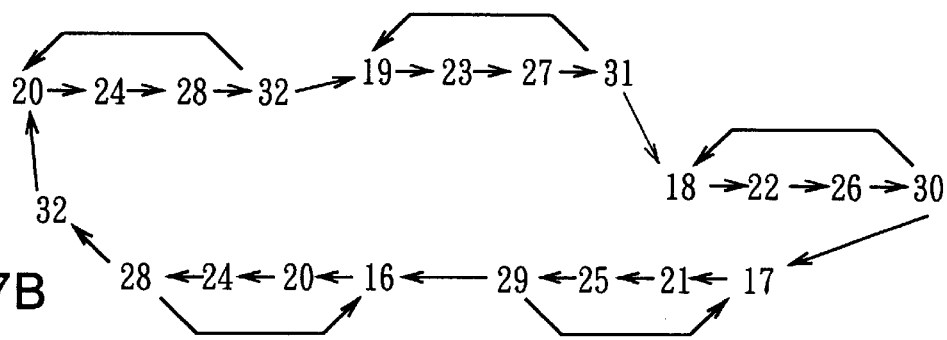
Figure 7C:
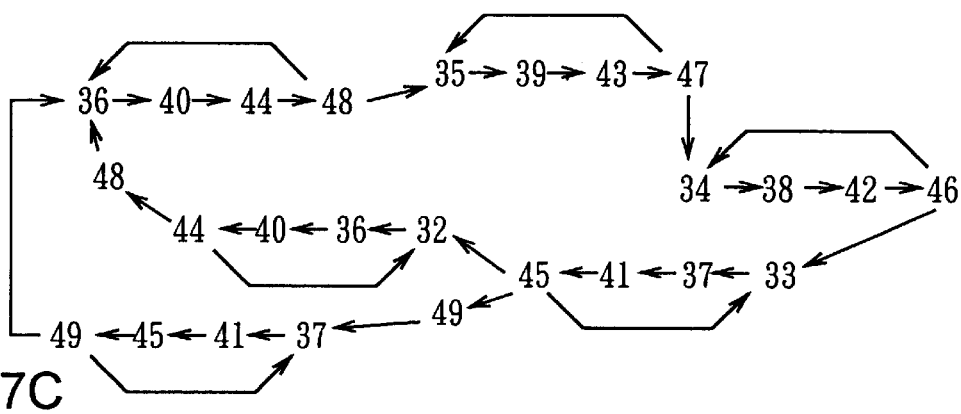

That is, as shown in FIG. 7C, in the case where the flag based on inputting of the trigger signal S16 has been set when the addressing division 21C is issuing such address values that the tap value which is read from the ROM 25C becomes the repeating state of 33, 37, 41, 45, the addressing division 21C moves to the transition state of the address value by which the tap value is changed within the repeating state of 32, 36, 40, 44. Then, after the control signal S21 has been inputted and the 48th tap value has been issued, it moves to the transition state of the address value by which the tap value is changed within the repeating state of 36, 40, 44, 48.

However, in this case, the trigger signal S16 is possible to be generated with the interval of forty-eight pulses or less, and, in the case where the trigger signal S16 has been continuously inputted with the interval of forty-eight pulses or less, the control signal S21 is inputted to the addressing division 21C when it is issuing such address values that the tap value which is read from the ROM 25C becomes the repeating state of 33, 37, 41, 45. In this case, after it has issued the 49th tap value, it moves to the transition state of the address value which causes the tap value to change within the repeating state of 37, 41, 45, 49. After this, since the trigger signal S16 is inputted, it moves to the transition state of the address value which causes the tap value to change within the repeating state of 36, 40, 44, 48.

Figure 7D:
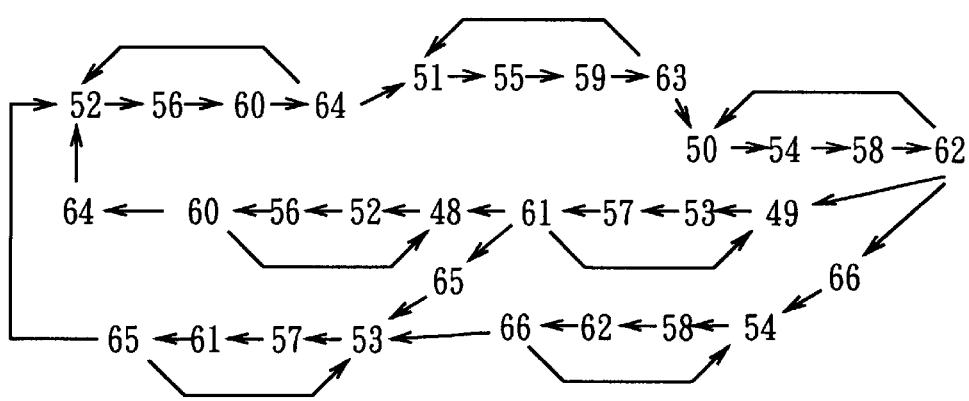

In like manner, there is the case where the trigger signal S16 is inputted to the addressing division 21D and the case where the control signal S21 is inputted to it, when it is issuing the address values which cause the tap value, which is read from the ROM 25D, to become the repeating state of 50, 54, 58, 62, as shown in FIG. 7D. The case where the control signal S21 is inputted is the case where the trigger signal S16 has been continuously inputted with the interval of forty-eight pulses or less. In the case where the trigger signal S16 has been inputted, the addressing division 21D moves to the transition state of the address value which causes the tap value to change within the repeating state of 49, 53, 57, 61, while, in the case where the control signal S21 has been inputted, it issues the 66th tap value and then moves to the transition state of the address value which causes the tap value to change within the repeating state of 54, 58, 62, 66.

Besides, in the case where the trigger signal S16 has been inputted and it has moved to the transition state of the address value which causes the tap value to change within the repeating state of 49, 53, 57, 61, there is the case where the trigger signal S16 is inputted and the case where the control signal S21 is inputted. The case where the control signal S21 is inputted is the case where the trigger signal S16 has been continuously inputted with the interval of sixty-four pulses or less. In the case where the trigger signal S16 has been inputted, the addressing division 21D moves to the transition state of the address value which causes the tap value to change within the repeating state of 48, 52, 56, 60, while, in the case where the control signal S21 has been inputted, it issues the 65th tap value and then moves to the transition state of the address value which causes the tap value to change within the repeating state of 53, 57, 61, 65.

In this way, the tap values are being stored in the respective ROMs 22A to 22D in accordance with the interval of the trigger signal S16; the respective addressing divisions 21A to 21D read the tap values from the corresponding ROM 25A to 25D in accordance with the transition of the address value, and deliver them to the multipliers 22A to 22D respectively.

On the other hand, the transmission filter 20 delays the base band signal S15 which is supplied from the transmission symbol generating division 16 (FIG. 3) for the definite time by the use of an input buffer (not shown), and then inputs it to the shift register 26A. In concrete terms, the base band signal S15 is delayed by the magnitude of one symbol of the case where the data is divided into units of a symbol. The shift register 26A stores thus inputted base band signal S15 in units of a symbol, and supplies this symbol unit data to the multiplier 22A. Besides, when the next symbol-unit data has been inputted, the shift register 26A shifts the previously stored symbol-unit data to the succeeding stage, the shift register 26B. The shift register 26B stores the symbol-unit data which has been inputted from the shift register 26A by shifting, and supplies the very same symbol-unit data to the multiplier 22B. Besides, when the next data has been shifted and inputted from the shift register 26A, the shift register 26B shifts the previously stored symbol-unit data to the succeeding stage, the shift register 26C. The shift register 26C stores the symbol-unit data which has been shifted and inputted from the shift register 26B, and supplies the very same symbol-unit data to the multiplier 22C. Besides, when the next symbol-unit data has been shifted and inputted from the shift register 26B, the shift register 26C shifts the previously stored symbol-unit data to the succeeding stage, the shift register 26D. The shift register 26D stores the symbol-unit data which has been shifted and inputted from the shift register 26C, and delivers the very same symbol-unit data to the multiplier 22D. Besides, when the next symbol-unit data has been shifted and inputted from the shift register 26C, the shift register 26D clears the previously stored symbol-unit data and stores the new symbol-unit data.

Each multiplier 22A to 22D multiplies each symbol-unit data of the base band signal which is thus delivered from the shift register 26A to 26D by the tap value which is given from the corresponding ROM 25A to 25D, at each timing which is indicated by the reference clock signal S20, and then delivers the obtained value to the adder 23. The adder 23 adds these values at every timing which is indicated by the reference clock signal S20, and gives the obtained quantized-signal S18 to the D/A converter 19. The D/A converter 19, which operates on the basis of the reference clock signal S20, converts the quantized signal S18 which is a digital signal into an analog signal and then outputs it. In this connection, the signal which has been converted into analog in this way is then inputted to an analog low-pass-filter (not shown), so that only the desired frequency components of it is taken out.

Here, the respective addressing divisions 21A to 21D calculate the address values for reading the tap values, with the control procedure which is described hereinafter, and then deliver the obtained address values to the corresponding ROMs 25A to 25D, respectively.

Figure 8:
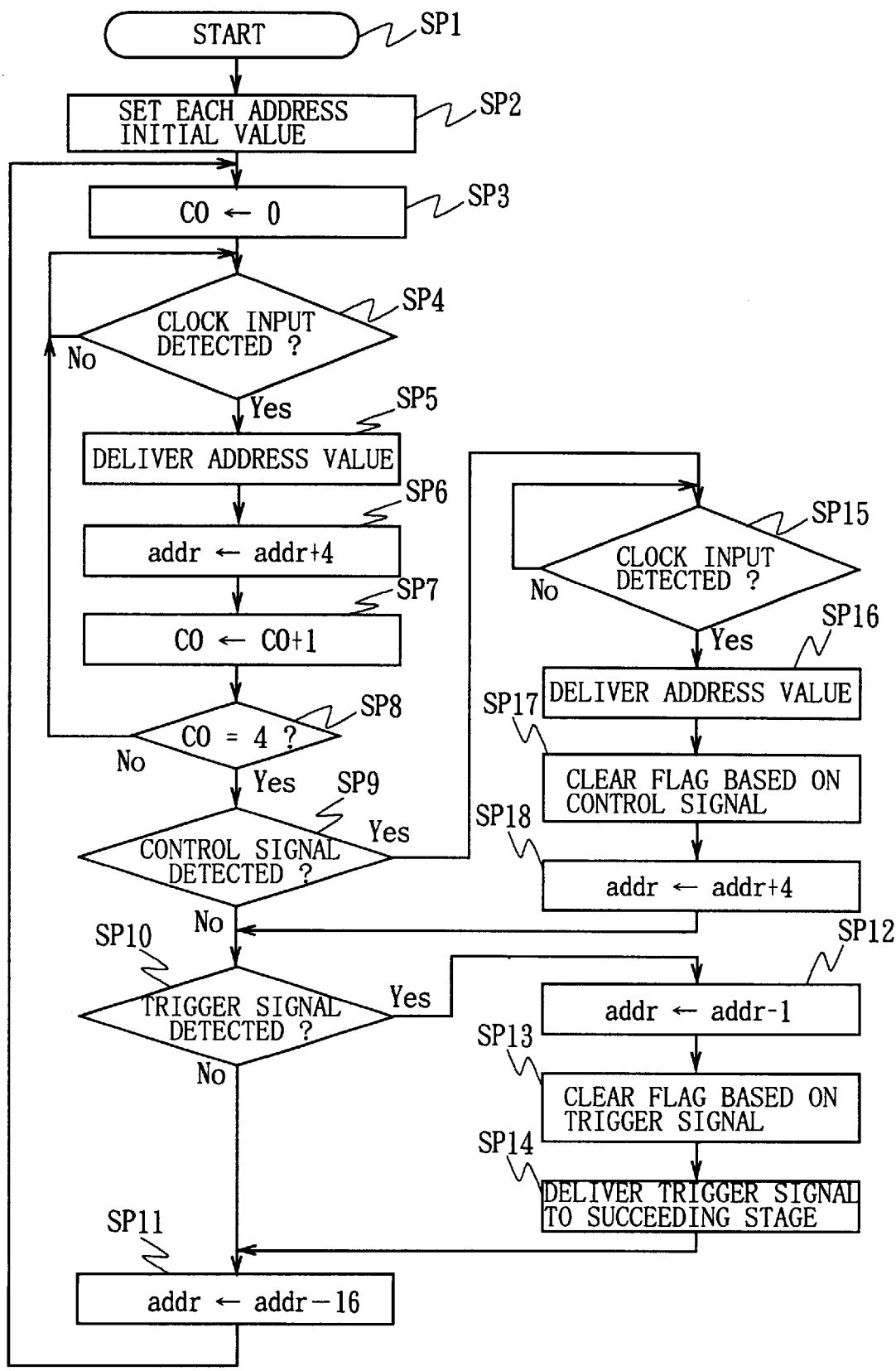
FIG. 8 is a flow chart illustrating the control procedure of each addressing division.

As shown in FIG. 8, the respective addressing divisions 21A to 21D start the procedure on the step SP1, and then firstly set the initial values of the address values which are to be delivered respectively to the corresponding ROMs 25A to 25D, on the step SP2. Next, at the step SP3, each addressing division 21A to 21D sets the count value CO of counting of the repeating state of the address value to zero. Subsequently, on the step SP4, each addressing division 21A to 21D should detect the clock inputting based on the reference clock signal S20. If not detected, the waiting state is maintained until being inputted; when detected, proceeds to the next step. Next, on the step SP5, each addressing division 21A to 21D which has detected the inputting of the clock delivers the set address-value to the corresponding ROM, and causes it to read the tap value which corresponds to the address value.

Each addressing division 21A to 21D which has delivered the address value in this way calculates the new address value for the next specification, on the step SP6. The address value which is newly specified is calculated by adding four to the address value which has been specified the last time. On the step SP7, each addressing division 21A to 21D adds one to the count value CO. On the step SP8, if the count value CO which is counted in this way is four, that is, if the steps SP4 to SP7 have been repeated four times, each addressing division 21A to 21D proceeds to the next step. If the count value CO is not four, the procedure returns to the step SP4, and repeats the existing address transition state.

If it has been determined on the step SP8 that the steps SP4 to SP7 have been repeated four times, then each addressing division 21A to 21D proceeds to the step SP9, and judges whether the control signal S21 has been inputted from the counter 24. In each addressing division 21A to 21D, a flag is set when the control signal S21 has been inputted, and so, if it has been inputted at any timing, it can be detected after that time. Here, if the flag which indicates that the control signal S21 has been inputted is on, it then proceeds to the step SP15, and if not, it proceeds to the step SP10.

In the case where the control signal S21 has been not inputted, each addressing division 21A to 21D judges whether the trigger signal S16 has been inputted from the clock frequency converter 12 (FIG. 3), on the step SP10. In each addressing division 21A to 21D, a flag is set when the trigger signal S16 has been inputted, and so, if it has been inputted at any timing, it can be detected after that time. Here, if the flag which indicates that the trigger signal S16 has been inputted is on, then proceeds to the step SP12, and if not, proceeds to the step SP11.

In the case where the control signal S21 or the trigger signal S16 has been not inputted at such a point of time that the transition state of the address value (SP4 to SP8) has been repeated four times in this way, each addressing division 21A to 21D subtracts sixteen from the existing address value and calculates the new address value hereby, on the step SP11. For instance, in the case where the address value is nineteen at the existing state, by subtracting sixteen from mod16, that is, the existing address value, three is obtained as the new address value. In such a case that the control signal S21 or the trigger signal S16 has been not inputted, the transition of the address is performed in the repeating state such as returning to three from fifteen in 3, 7, 11, 15 (SP3 to SP11), and returns to the step SP3.

On the other hand, in the case where the control signal S21 has been not inputted and the trigger signal S16 has been inputted, each addressing division 21A to 21D subtracts one from the address value and calculates the new address value hereby. After this, on the step SP13, each addressing division 21A to 21D clears the flag which has been set based on the trigger signal S16, and delivers the very same trigger signal S16 to the succeeding stage on the step SP14. That is, the trigger signal S16 is inputted to the addressing division 21A at first, and, after clearing of the flag at the step SP13, inputted to the succeeding stage, the addressing division 21B. In like manner, it is inputted to the addressing division 21C from the addressing division 21B, and to the addressing division 21D from the addressing division 21C, after the flag has been cleared on the step SP13 respectively.

After each addressing division 21A to 21D has delivered the trigger signal S16 to the succeeding stage, it proceeds to the step SP11, and calculates the new address value. At this time, since each address value has been reduced by one, shifting to the new repeating state has been done (FIG. 5).

While, in the case where the control signal S21 has been inputted, each addressing division 21A to 21D proceeds to the step SP15, and judges whether the clock input based on the reference clock signal S20 has been detected. If it has been not detected, the waiting state is still maintained until it is inputted, and when it has been detected, proceeds to the next step. Each addressing division 21A to 21D which has detected the clock input then delivers the address value which has been obtained in the existing state to the corresponding ROM 25A to 25D. Subsequently, each addressing division 21A to 21D clears the flag which has been set on the basis of the inputting of the control signal S21, on the step SP17. After clearing of the flag, each addressing division 21A to 21D adds four to the address value, on the step SP18. After this, each addressing division 21A to 21D proceeds to the step SP10, so as to perform detection of the trigger signal S16; when it has been detected, proceeds to the step SP12, and when not detected, proceeds to the step SP11.

Figure 9:
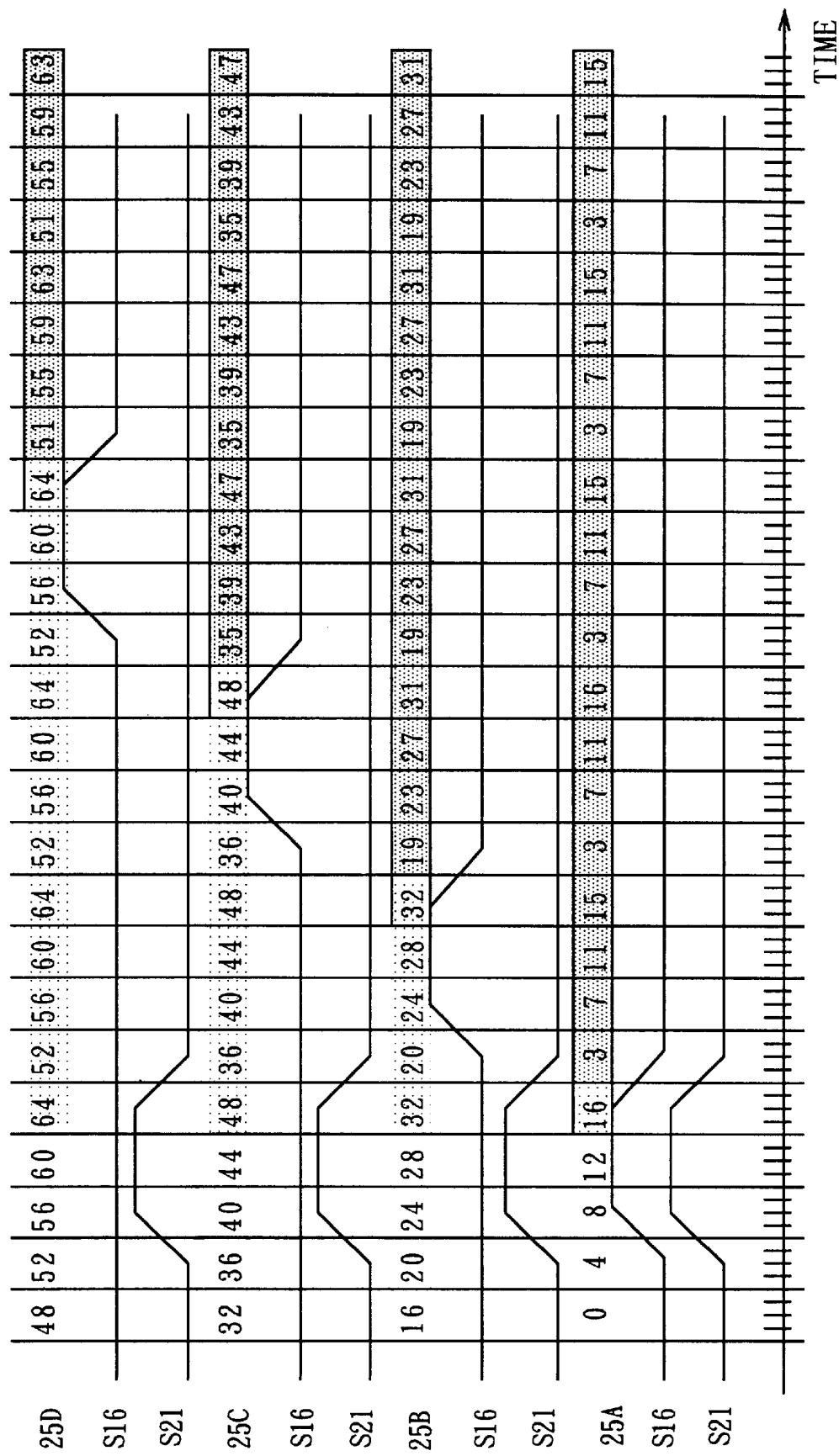
FIG. 9 is a time chart used in explanation of the tap value which changes in accordance with the address value which is issued by each addressing division in the case where the control signal is not given from the counter.

As shown in FIG. 9, in each addressing division 21A to 21D, the transition state of the address value is changed from the stated repeating state to the other repeating state, in the cases of the specific conditions, that is, in the case where the trigger signal S16 has been inputted, and the case where the control signal S21 has been inputted from the counter 24 which has counted inputting of the trigger signal S16 four times.

In the case where the flag which is set on the basis of the fact that the control signal S21 has been inputted has been set, for instance the addressing division 21A changes the transition state of the address value by which the tap value is changed within the repeating state of 0, 4, 8, 12 to the new transition state, the repeating state of 3, 7, 11, 15, after it has delivered the address value for specifying the 16th tap value. In like manner, in the case where the flag based on inputting of the control signal S21 has been set, the addressing division 21B changes the transition state of the address value by which the tap value is changed within the repeating state of 16, 20, 24, 28 to the new transition state, that is, the repeating state of 20, 24, 28, 32, after it has delivered the address value for specifying the 32nd tap value. While, the addressing division 21C changes the transition state of the address value by which the tap value is changed within the repeating state of 32, 36, 40, 44 to the new transition state, that is, the repeating state of 36, 40, 44, 48, after it has delivered the address value for specifying the 48th tap value. Besides, the addressing division 21D changes the transition state of the address value by which the tap value is changed within the repeating state of 48, 52, 56, 60 to the new transition state, the repeating state of 52, 56, 60, 64, after it has delivered the address value for specifying the 64th tap value.

In the above configuration, the transmission filter 20 is not driven with 19.8 MHz as with the case of the transmission filter 14 (FIG. 3), but it is adapted to be driven with ¼ of that, 4.95 MHz; so, it issues the address value, which is specified in order to read the tap value, in such a manner that it skips to the fourth. That is, because the tap values themselves which are stored in ROMs 25A to 25D are the tap values for 16× over-sampling, by reading them employing the address values which are issued in such a skip-to-fourth manner, it is able to perform 16× over-sampling of the base band signal S15 with 4.95 MHz, that is, ¼ of the original sampling frequency.

Besides, the information of the discrepancy between the base band signal S15 and the reference clock signal S20 which is indicated by the trigger signal S16 is also reflected to address specification, by the trigger signal S16 and the control signal S21 which is issued from the counter 24 once for every four reception of the very trigger signal S16; in response to this, each addressing division 21A to 21D shifts the address value in order to correct the deviation of the timing.

That is, the transmission filter 20 calculates the address value, which is specified in order to read the tap value, in a skip-to-fourth manner from the starting address value at the timing of the reference clock signal S20 of 4.95 MHz, and, when the trigger signal S16 or the control signal S21 has been inputted, it specifies the address by shifting the starting address value so as to vary the magnification ratio of sampling, so that it is able to correct the discrepancy of the timings of the base band signal S15 and the reference clock signal S20, and to normalize the base band signal S15 with the timing of the reference clock signal S20. By this, the transmission filter 20 can be formed with a simple configuration wherein the re-sampler 17 and the digital filter 18 are united, and it can be driven with the slow-speed clock in comparison with the transmission filter 14 (FIG. 3); besides, it can normalize the base band signal S15 with the timing of the reference clock signal S20 and perform the over-sampling processing and the filtering processing.

Besides, the transmission filter 20 is adapted to temporarily store the base band signal S15 in an input buffer (not shown) and then input it to the shift register 26A to 26D. That is, since the trigger signal S16 is not always inputted at the ideal timing (FIG. 9), inputting of the base band signal S15 is thus delayed by the stated time by the use of the input buffer, so that address specification, toward the ROM 25A to 25D, based on the address value which is delivered from the addressing division 21A to 21D can be surely performed.

According to the above configuration, the address value, which is specified in order to read the tap value stored in the ROM 25A to 25D for the sake of 16× over-sampling of the base band signal S15, is calculated by the addressing division 21A to 21D such that it skips to the fourth, and, on the particular occasions where the trigger signal S16 has been inputted or the control signal S21 is delivered by the counter 24 once for every four inputting of the trigger signal S16, transition of the address value is performed and the over-sampling ratio of sampling is varied, and so, the discrepancy of the timings of the base band signal S15 and the reference clock signal S20 is corrected and the base band signal S15 is normalized with the timing of the reference clock signal S20, therefore, such a configuration is enabled that the re-sampler 17 and the digital filter 18 (FIG. 3) are united, and it is able to perform 16× over-sampling which is similar to that of the case where the clock signal S11 of 19.8 MHz has been used, with the timing of the reference clock signal S20 of 4.95 MHz, and it is able to correct the synchronous discrepancy between the reference clock signal S20 and the base band signal S15. In this way, it is able to realize the transmission filter 20 which has a simple configuration and can be driven with a low-speed clock, wherein the spectral distortion which is due to the asynchronous frequency occurring in the base band signal S15 can be reduced to minimum.

In the above first embodiment, the description has been given of the case where the clock signal S11 of 19.8 MHz which has been generated by the oscillator 11 which is the reference signal generating means is converted into the reference clock signal S13 of 19.6608 MHz by means of the clock frequency converter 12 which is the frequency converting means, and subjected to frequency dividing of the over-sampling ratio of sixteen by the frequency divider 15, so that the reference clock signal S14 of 1.2288 MHz which is synchronized with the base band signal S15 is generated; however, we do not intend to limit the present invention to this case; for instance, such a procedure is also possible that a clock signal of 19.8 MHz which has been generated by an oscillator is subjected to frequency dividing so that the frequency is lowered, and then this is converted into a frequency which is synchronized with the base band signal.

Besides, in the above first embodiment, the description has been given of the case where the clock signal S11 of 19.8 MHz is supplied to the re-sampler 17 and the digital filter 18 which are the normalizing means; however, we do not intend to limit the present invention to this case; for instance, such a procedure is also possible that over-sampling is performed with a over-sampling ratio of four rather than the over-sampling sixteen, so that the clock signal of 4.95 MHz is supplied.

Besides, in the above first embodiment, the description has been given of the case where the clock signal S11 of 19.8 MHz is converted into the reference clock signal S13 of the frequency 19.6608 MHz by the clock frequency converter 12, and the base band signal S15 of the frequency 1.2288 MHz is produced in the transmission symbol generating division 5 which is a transmission symbol generating means; however, the present invention is applicable not merely to this case, but to such a case that the clock signal is generated such that it has a frequency other than 19.8 MHz, and the base band signal is generated such that it has a frequency other than 1.2288 MHz. In this case, the desired reference clock signal can be also obtained by varying the frequency of the clock signal, by changing the interval for removing the pulse-wave from the clock signal with the clock frequency converter, and the base band signal of the desired frequency can be produced from thus obtained reference clock signal.

Besides, in the above second embodiment, the description has been given of the case where the trigger signal S16 which is supplied from the clock frequency converter (FIG. 3) is utilized as a detecting means for detecting the discrepancy of the timings of the reference clock signal S20, which has been produced by dividing and lowering the frequency of the clock signal S11 into one quarter of it, and the base band signal S15; however, we do not intend to limit the present invention to this case; in the case where a high-precision clock can be obtained from the received signal in the same way as, for instance, a communication terminal equipment, the trigger signal for indicating the discrepancy of the timings of the reference clock signal S20 and the base band signal S15 may be produced on the basis of the clock signal which has been obtained from the very same received signal. That is, the trigger signal may be supplied with the help of the other configuration which can generate the trigger signal for notifying the discrepancy of the timings.

Besides, in the above second embodiment, the description has been given of the case of the transmission filter 20 which has such a configuration that the digital filter whose number of taps is sixty-four or sixty-five has been integrated with the re-sampler; however, the present invention is applicable not merely to this case, but applicable to a transmission filter which has such a configuration that the digital filter whose number of taps is sixty-three has been integrated with the re-sampler; that is, it is not limited by the number of the taps.

As described above, the present invention provides a detecting means for detecting the timings of each of the reference signal of the stated frequency and the data signal which is not synchronized with the reference signal and issuing a control signal in the case where a temporal discrepancy which exceeds the stated interval has been detected between the timings of the reference signal and the data signal, and a normalizing means for re-sampling the data signal on the basis of the reference signal, and changing the over-sampling ratio of the re-sampling into the stated over-sampling ratio so as to normalize the data signal with the timing of the reference signal on only the occasion of such a timing that the control signal has been inputted; by changing the magnification ratio of the re-sampling on only the occasion of such a timing that a temporal discrepancy has been detected between the reference signal and the data signal, it is able to correct the temporal discrepancy which is due to the fact that the frequency of the reference signal and the frequency of the data signal are not synchronized with each other and to prevent spectral distortion of the transmission signal, and it is able to utilize the reference signal, which is to be supplied to the other system and is not synchronized with the data signal, for generation of the transmission signal without any trouble. In this way, it is able to correct the spectral distortion of the signal owing to the jitter components and to simplify the configuration.

While the above has been described in connection with the preferred embodiments of the invention, it will be obvious to those skilled in the art that various changes and modifications may be made, therefore it is an object, to cover in the appended claims all such changes and modifications as fall within the true spirit and scope of the invention.

What is claimed is:

1. A filter device for filtering a data signal having a frequency to be transmitted, the filter device comprising:

reference clock means for producing a first reference clock signal having a predetermined frequency;

transmission symbol generating means receiving the data signal to be transmitted and for generating therefrom the data signal which is asynchronous with said first reference clock signal;

trigger signal generating means receiving said first reference clock signal for generating a trigger signal having frequency which is a first integer of the frequency of the data signal when a difference that exceeds one pulse of said first reference clock signal occurs between the first reference clock signal and said data signal and for generating a second reference clock signal fed to said transmission symbol generating means; and digital circuit means for re-sampling said data signal in accordance with said first and second reference clock signals and for changing an over-sampling ratio of said re-sampling by increasing or reducing a sampling period of said re-sampling by said one pulse of said first reference clock signal in response to said trigger signal and for filtering the re-sampled data signal before transmitting to an output.

2. The filter device according to claim 1, wherein said trigger signal generating means removes the one pulse from said first reference clock signal at predetermined intervals, so as to generate said second reference clock signal used by said transmission symbol generating means to generate said data signal and produces said trigger signal fed to said digital circuit means at said predetermined intervals.

3. The filter device according to claim 1, wherein said digital circuit means comprises a digital filter for filtering said re-sampled data signal on the basis of a third reference clock signal having a frequency of one over a second integer of a frequency of said first reference clock signal from said reference clock means.

4. The filter device according to claim 1, wherein said data signal is divided into symbols by said transmission symbol generating means and said digital circuit means comprises:

shift register means having a plurality of storage positions for storing data of each said symbol and for successively shifting said data at each storage position at a timing of inputting each symbol of said data signal to said shift register means;

a plurality of storage means for respectively storing tap values for digital-filter-processing said data signal and for reading out said tap values in response to respective address values fed thereto;

addressing means for changing an initial address value of said plurality of storage means by increasing or reducing by one in response to said trigger signal and for supplying to each of said plurality of storage means an address value that sequentially increases by fixed integer values from said initial address value;

a plurality of multipliers for respectively multiplying said data read from said shift register means and said tap values read out from said plurality of storage means; and an adder for adding together multiplied results of said multipliers and outputting an added result.

5. The filter device according to claim 4, wherein after increasing the address value a predetermined number of times by said fixed integer values from said initial address value when said trigger signal is supplied, said addressing means returns the address value to said initial address value.

6. The filter device according to claim 4, wherein said addressing means comprises counter means for supplying the address values to said respective plurality of storage means, and said plurality of counter means are connected so that said trigger signal is transmitted to a next stage of said counter means at a timing when each symbol of said data signal is inputted.

7. The filter device according to claim 4, wherein when said trigger signal is generated a predetermined number of times, the tap value at a respective final address position of said plurality of storage means is read out and thereafter the tap value corresponding to said initial address value is read out.

* * * * *